(12) United States Patent
Tokuda et al.

(10) Patent No.: US 11,410,691 B2
(45) Date of Patent: Aug. 9, 2022

(54) WIRING BOARD UNIT FOR DISK DEVICES, ACTUATOR ASSEMBLY FOR DISK DEVICES AND DISK DEVICE COMPRISING THE SAME

(71) Applicants: Kabushiki Kaisha Toshiba, Tokyo (JP); Toshiba Electronic Devices & Storage Corporation, Tokyo (JP)

(72) Inventors: Kota Tokuda, Kawasaki Kanagawa (JP); Nobuhiro Yamamoto, Yokohama Kanagawa (JP); Yousuke Hisakuni, Sagamihara Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/222,334

(22) Filed: Apr. 5, 2021

(65) Prior Publication Data

US 2021/0225395 A1 Jul. 22, 2021

Related U.S. Application Data

(63) Continuation of application No. 16/298,325, filed on Mar. 11, 2019, now abandoned.

(30) Foreign Application Priority Data

Sep. 19, 2018 (JP) .............................. JP2018-174648

(51) Int. Cl.
*G11B 5/48* (2006.01)
*H05K 1/02* (2006.01)
(Continued)

(52) U.S. Cl.
CPC ............ *G11B 5/4806* (2013.01); *H02K 11/30* (2016.01); *H02K 41/0356* (2013.01);
(Continued)

(58) Field of Classification Search
None
See application file for complete search history.

(56) References Cited

U.S. PATENT DOCUMENTS 5,095,396 A 3/1992 Putnam et al.
5,103,359 A 4/1992 Marazzo
(Continued)

FOREIGN PATENT DOCUMENTS

JP H03-5296 U 1/1991
JP 2642922 B2 8/1997
(Continued)

*Primary Examiner* — William J Klimowicz
(74) *Attorney, Agent, or Firm* — Allen & Overy LLP

(57) ABSTRACT

According to one embodiment, a wiring board unit includes a reinforcing board, a flexible printed circuit board includes a joint portion including a first plane and a second plane and attached on the reinforcing board, a relay unit extending from the first plane, a plurality of connection pad groups located on one of the first plane and the second plane and a first IC chip mounted on the first plane, and the joint portion is bent on a boundary between the first plane and the second plane.

16 Claims, 14 Drawing Sheets

(51) Int. Cl.
  *H05K 1/18* (2006.01)
  *H05K 1/11* (2006.01)
  *H02K 11/30* (2016.01)
  *H02K 41/035* (2006.01)

(52) U.S. Cl.
  CPC ............ *H05K 1/028* (2013.01); *H05K 1/111* (2013.01); *H05K 1/118* (2013.01); *H05K 1/189* (2013.01); *H02K 2211/03* (2013.01); *H05K 2201/055* (2013.01); *H05K 2201/10053* (2013.01); *H05K 2201/10083* (2013.01); *H05K 2201/10409* (2013.01); *H05K 2201/10522* (2013.01)

(56) References Cited

U.S. PATENT DOCUMENTS

| | | |
|---|---|---|
| 5,117,282 A | 5/1992 | Salatino |
| 5,276,572 A | 1/1994 | Kinoshita et al. |
| 5,539,595 A | 7/1996 | Beck et al. |
| 5,583,720 A | 12/1996 | Ishida et al. |
| 5,781,380 A | 7/1998 | Berding et al. |
| 5,883,761 A | 3/1999 | Kasetty et al. |
| 5,907,452 A * | 5/1999 | Kan ................... G11B 5/4833 360/99.16 |
| 5,923,501 A | 7/1999 | Suzuki et al. |
| 6,021,025 A | 2/2000 | Komura et al. |
| 6,166,888 A * | 12/2000 | Tsuda ................... H05K 1/189 360/264.2 |
| 6,236,531 B1 | 5/2001 | Allsup et al. |
| 7,227,725 B1 | 6/2007 | Chang et al. |
| 8,111,485 B2 | 2/2012 | Freeman et al. |
| 8,144,432 B2 | 3/2012 | Freeman et al. |
| 9,788,426 B2 | 10/2017 | Ishida et al. |
| 10,424,345 B1 | 9/2019 | Namihisa et al. |
| 10,475,475 B2 * | 11/2019 | Hasegawa ........... G11B 5/4846 |
| 11,108,178 B2 * | 8/2021 | Yamamoto ............ H01R 12/79 |
| 2003/0043508 A1 | 3/2003 | Schulz et al. |
| 2016/0314808 A1 * | 10/2016 | Iwahara ............... G11B 5/4846 |
| 2019/0335581 A1 | 10/2019 | Tokuda et al. |

FOREIGN PATENT DOCUMENTS

| | | |
|---|---|---|
| JP | H10-241133 A | 9/1998 |
| JP | 2005-190504 A | 7/2005 |
| JP | 2008-159129 A | 7/2008 |
| JP | 2019-192801 A | 10/2019 |

* cited by examiner

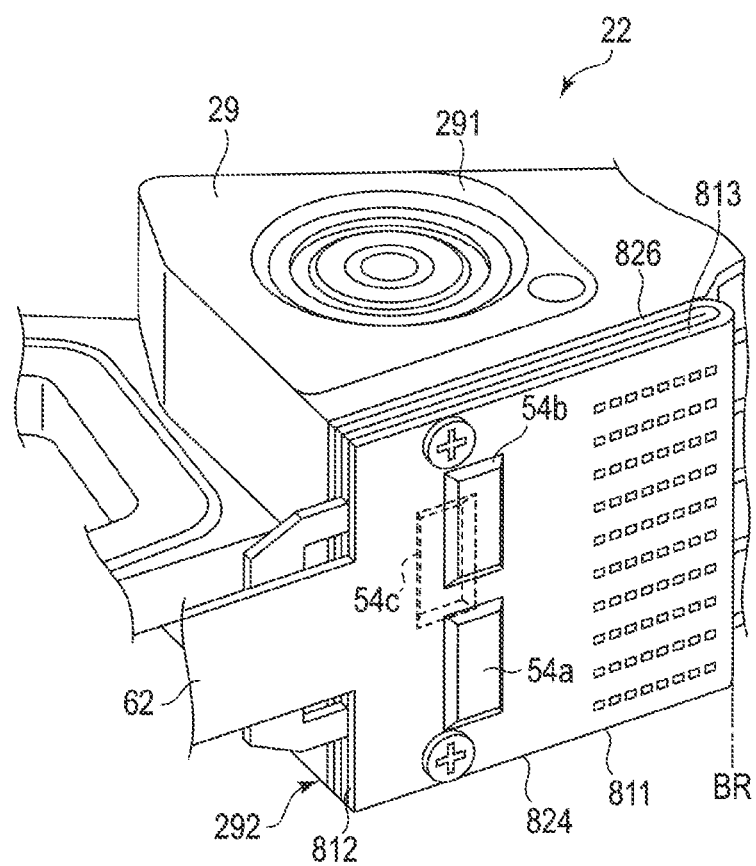
F I G. 9

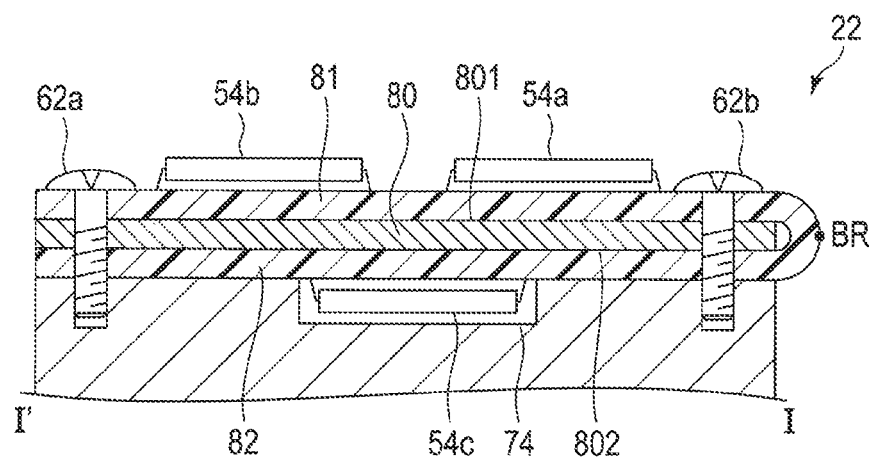
F I G. 14
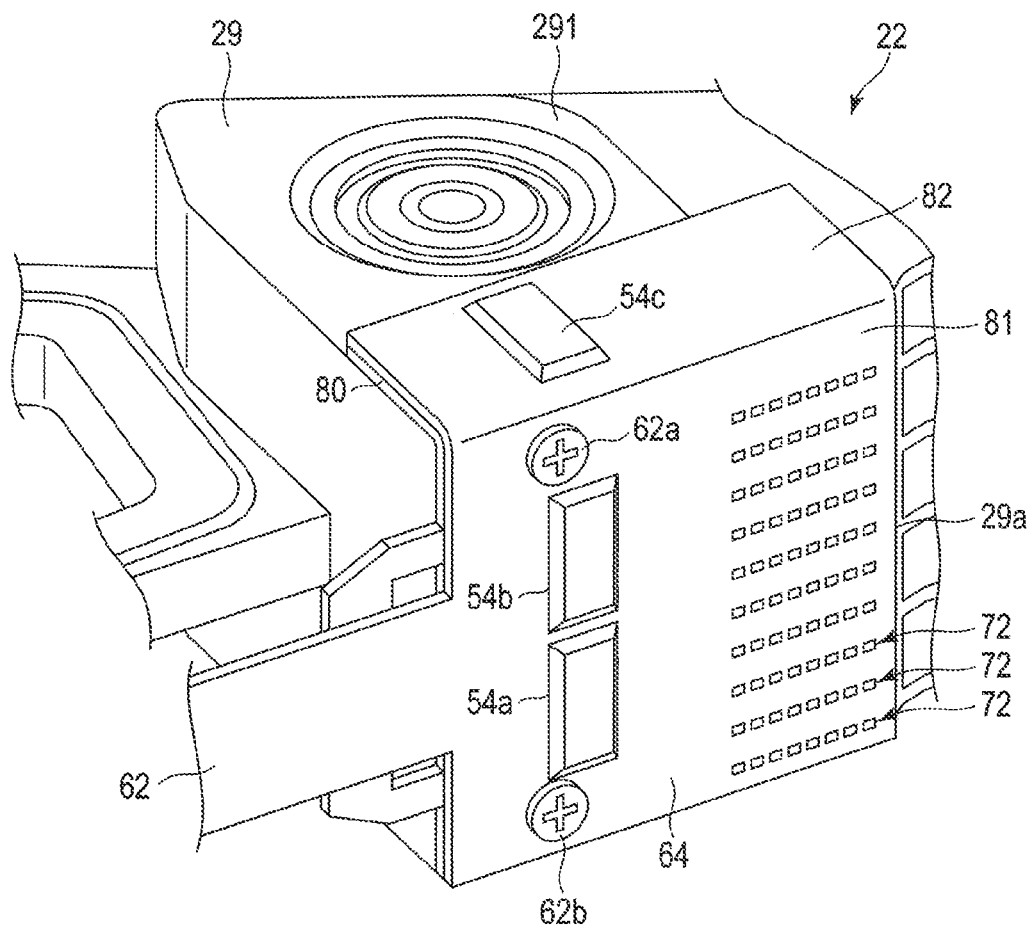
F I G. 15

WIRING BOARD UNIT FOR DISK DEVICES, ACTUATOR ASSEMBLY FOR DISK DEVICES AND DISK DEVICE COMPRISING THE SAME

CROSS-REFERENCE TO RELATED APPLICATIONS

This application is a continuation of application Ser. No. 16/298,325 filed Mar. 11, 2019 and is based upon and claims the benefit of priority from Japanese Patent Application No. 2018-174648, filed Sep. 19, 2018, the entire contents of which are incorporated herein by reference.

FIELD

Embodiments described herein relate generally to a wiring board unit for disk devices, an actuator assembly for disk devices, and a disk device comprising the same.

BACKGROUND

As such a disk device, for example, a magnetic disk drive generally comprises a magnetic disk provided in a base, a spindle motor which supports and rotates the magnetic disk, and an actuator assembly which supports a magnetic head. A flexible printed circuit board (FPC) provided in an actuator block of the actuator assembly comprises IC chips mounted thereon. In recent years, as the capacity of HDDs increases, the number of magnetic disks installed tends to increase. Accordingly, the number of IC chips and the wiring density on the FPC need to be increased. However, there is a certain limitation in the size of FPC, and it is difficult to secure the space for mounting.

BRIEF DESCRIPTION OF THE DRAWINGS

FIG. 9 is a perspective view of a state where the joint portion and the reinforcing board are fixed to the actuator block in a step shown in FIG. 8.

FIG. 14 is a cross section of the actuator assembly taken along line I-I' shown in FIG. 5.

FIG. 15 is a perspective view showing an actuator assembly according to a second embodiment.

DETAILED DESCRIPTION

Figure 1:
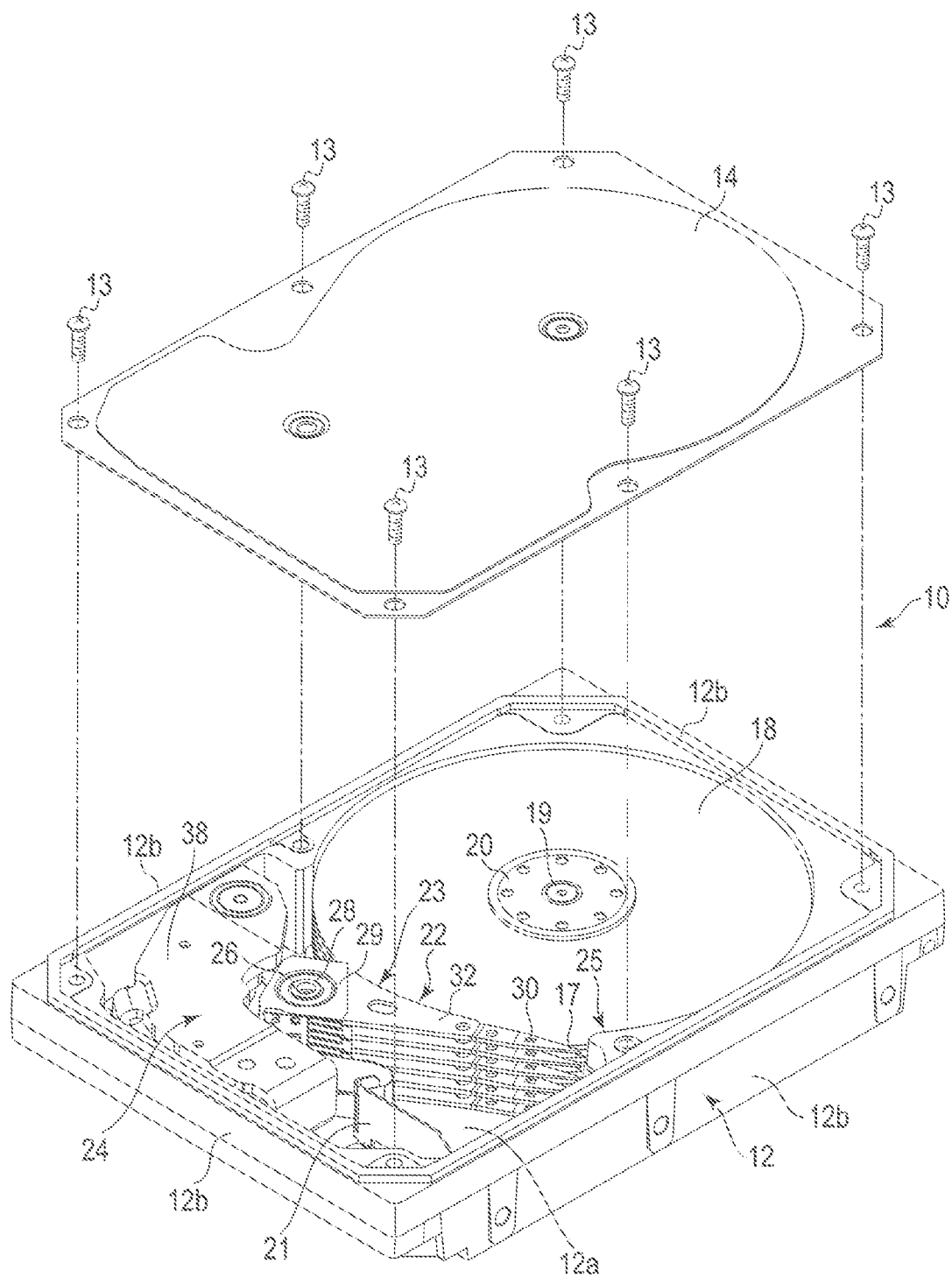
FIG. 1 is an exploded perspective view showing an HDD with a top cover removed.

In general, according to one embodiment, a wiring board unit comprises a reinforcing board, a flexible printed circuit board comprising a joint portion attached on the reinforcing board and including a first plane and a second plane, a relay unit extending from the first plane, a plurality of connection pad groups located on one of the first plane and the second plane and a first IC chip mounted on the first plane, and the joint portion is bent on a boundary between the first plane and the second plane.

Disk devices according to embodiments will be described with reference to the drawings.

What is disclosed in this specification is merely an example. Appropriate modifications which can be easily conceived by a person ordinarily skilled in the art without departing from the spirit of the embodiments naturally fall within the scope of the present invention. To further clarify explanation, for example, the width, thickness or shape of each structure may be schematically shown in the drawings compared with the actual forms. Note that the drawings are merely examples and do not limit the interpretation of the present invention. In the specification and drawings, elements which are identical to those of the already-mentioned figures are denoted by the same reference numbers. Thus, the detailed explanation of such elements may be omitted.

As a disk device, a hard disk drive (HDD) will be described in detail.

FIG. 1 is an exploded perspective view showing the HDD with a top cover removed.

The HDD comprises a flat and substantially rectangular housing 10. The housing 10 comprises a rectangular box shaped base 12 with an upper surface opened, and a top cover 14. The base 12 comprises a rectangular bottom wall 12a opposing the top cover 14 with a gap therebetween, and a plurality of sidewalls 12b standing along edges of the bottom wall, which are formed integrally as one from, for example, aluminum. The top cover 14 is formed, for example, into a rectangular plate shape from stainless steel. The top cover 14 is screwed on the sidewalls 12b of the base by a plurality of screws 13 and closes the upper opening of the base 12.

In the housing 10, a plurality of magnetic disks 18 as recording media, and a spindle motor 19 provided as a drive unit which supports and rotates the magnetic disks 18. The spindle motor 19 is disposed on the bottom wall 12a. The magnetic disks 18 each have a diameter of, for example, 3.5 inches, and comprise a magnetic recording layer on an upper surface and/or a lower surface thereof. The magnetic disks 18 are each fitted coaxially on a hub (not shown) of the spindle motor 19, and clamped by a clamp spring 20, so as to be secured to the hub. In this way, each of the magnetic disks 18 is supported parallel to the bottom wall 12a of the base 12. The magnetic disks 18 are rotated at a predetermined number of revolutions by the spindle motor 19. In this embodiment, for example, five magnetic disks 18 are accommodated in the housing 10, but the number of magnetic disks 18 is not limited to this.

In the housing 10, an actuator assembly 22 is provided, which comprises a plurality of magnetic heads 17 which record and reproduce data with respect to the magnetic disks 18 so as to movably support the magnetic heads 17 with respect to the magnetic disks 18. Further, the housing 10 accommodates a voice coil motor (hereinafter referred to as VCM) 24 which rotates and positions the actuator assembly 22, and a ramped loading mechanism 25 which holds the magnetic heads 17 at an unloading position away from the magnetic disks 17 when the magnetic heads 17 are moved to the outermost circumference of the magnetic disks 18.

The actuator assembly 22 comprises a head actuator 23 and a wiring board unit (FPC unit) 21 including electronic parts such as conversion connectors mounted thereon, and connected to the head actuator 23. The head actuator 23 comprises an actuator block 29 pivotably supported around a support shaft 26 through a bearing unit 28, the bearing unit 28 being rotatable, a plurality of arms 32 extending from the actuator block 29, and suspension assemblies 30 extending respectively from the arms 32, and the magnetic heads 17 are supported by the distal end portions of the respective suspension assemblies 30. The support shaft 26 is formed to stand on the bottom wall 12a. The magnetic heads 17 each comprise a read element, a write element, etc.

A printed circuit board (not shown) is attached to an outer surface of the bottom wall 12a of the base 12. The printed circuit board constitutes a control unit, and the control unit controls the operation of the spindle motor 20, and also controls the operation of the VCM 24 and the magnetic heads 32 via the board unit 21.

Figure 2:
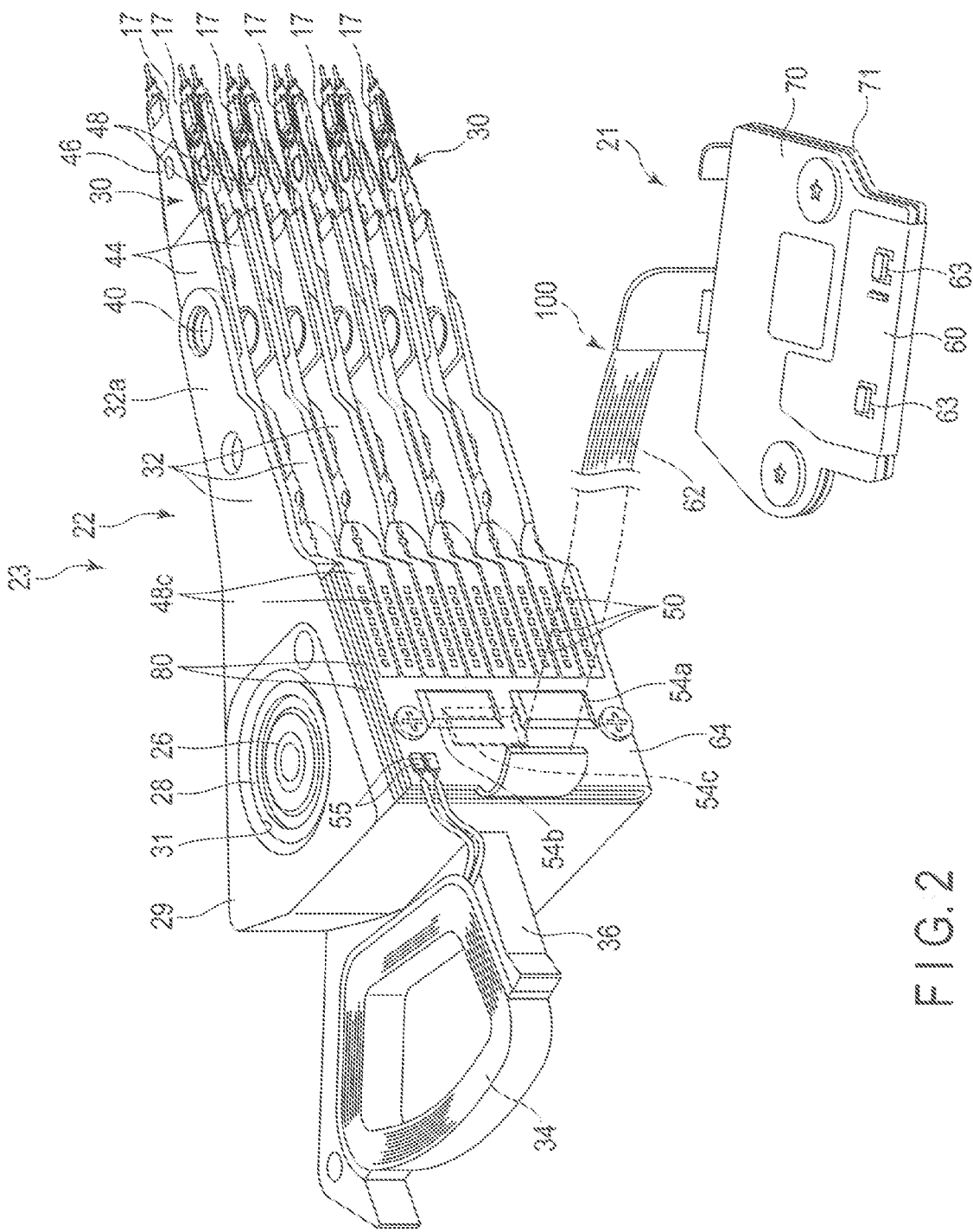
FIG. 2 is a perspective view showing an actuator assembly.
Figure 3:
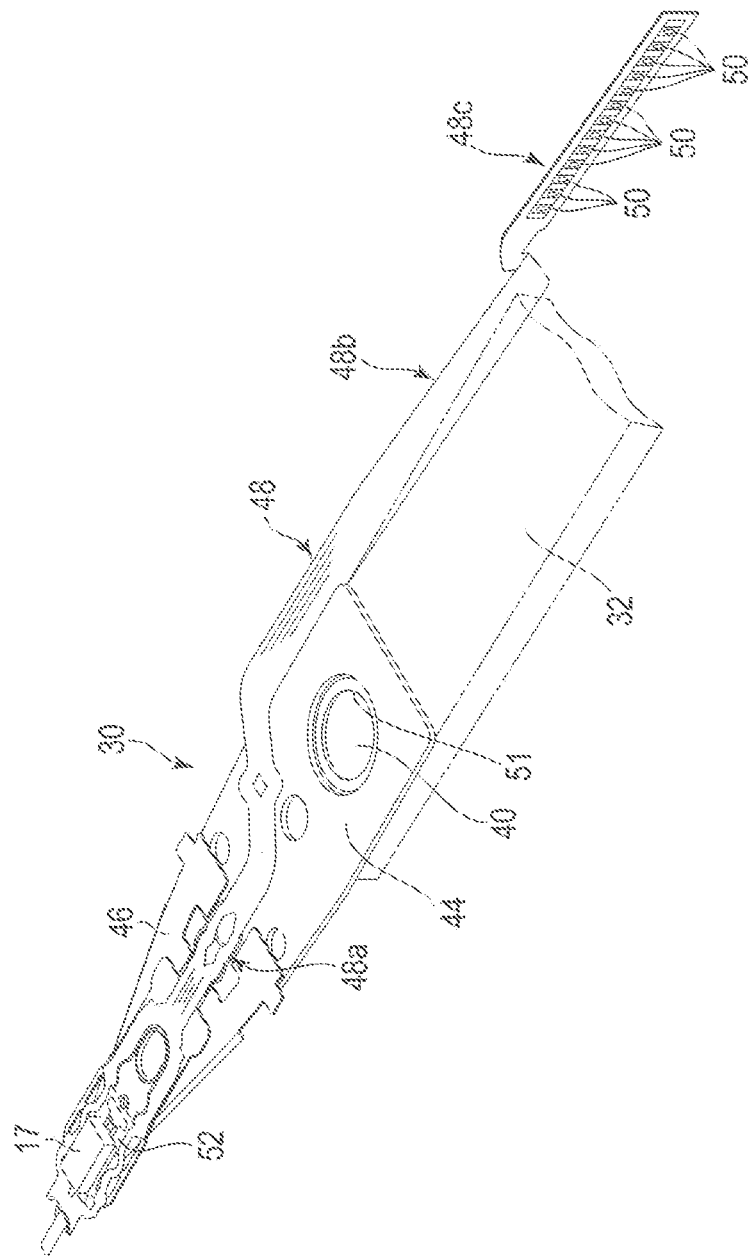
FIG. 3 is a perspective view showing a suspension assembly.

FIG. 2 is a perspective view showing the actuator assembly 22. FIG. 3 is a perspective view showing the suspension assembly 30.

The actuator assembly 22 includes the head actuator 23 and the wiring board unit 21. As shown in FIG. 2, the head actuator 23 includes the actuator block 29 comprising a through hole 31, and the bearing unit (unit bearing) 28 provided in the through hole 31, a plurality of, for example, six arms 32 extending from the actuator block 29, the suspension assembly 30 attached to each of the arms 32, and the magnetic heads 17 supported by the extending ends of the respective suspension assemblies 30. The actuator block 29 is pivotally supported around the support shaft (pivot) 26 provided to stand on the bottom wall 12a, by the bearing unit 28.

The actuator block 29 and the six arms 32 are formed integrally as one body from aluminum or the like, and constitute the so-called E block. The arms 32 are each formed into, for example, a long and slender plate shape, and extend from the actuator block 29 in a direction normal to the support shaft 26. The six arms 32 are provided parallel to each other with respective gaps between each adjacent pairs of arms.

The head actuator 23 comprises a support frame 36 extending from the actuator block 29 in a direction opposite to the arms 32, and the support frame 36 supports a voice coil 34, which is a part of the VCM 24. As shown in FIG. 1, the voice coil 34 is located between a pair of yokes 38, one of which is fixed on the base 12 and the yokes 38 and a magnet fixed to one of the yokes constitute the VCM 24.

The head actuator 23 comprises eight suspension assemblies 30 each supporting each respective magnetic head 17. The suspension assemblies 30 extend from the actuator block 29, and are attached respectively to the distal end portions 32a of the arms 32. The suspension assemblies 30 include up-head suspension assemblies each supporting the respective magnetic head 17 upward, and down-head suspension assemblies each supporting the respective magnetic head 17 downward. The up-head suspension assemblies and down-head suspension assemblies are constituted by arranging the suspension assemblies 30 of the same structure so that some face upwards and the others face downwards.

In this embodiment, as shown in FIG. 2, a down-head suspension assembly 30 is attached to the uppermost arm 32, and an up-head suspension assembly 30 is attached to the lowermost arm 32. Up-head suspension assemblies 30 and down-head suspension assemblies 30 are attached respectively to the four arms 32 in the middle.

As shown in FIG. 3, the suspension assemblies 30 each comprise a substantially rectangular base plate 44, a slender plate spring-like load beam 46, and a slender belt-like flexure (wiring member) 48. The load beam 46 is fixed to an end portion of the base plate 44 while a proximal end portion thereof overlapping the end portion. The load beam 46 is formed to extend out from the base plate 44, and tapered down towards its extending end. The base plate 44 and the load beam 46 are formed from, for example, stainless steel.

The base plate 44 comprises, at the proximal end portion thereof, a circular opening, and an annular protrusion 51 positioned around the opening. The base plate 44 is fastened to the distal end portion 32a of the arm 32 by fitting the annular protrusion 51 of the base plate 44 into a calking hole 40 formed in the distal end portion 32a of the arm 32 and calking the protrusion 51 (See FIG. 2). The proximal end portion of the load beam 46 is fixed to the base plate 44 by disposing it to overlap the distal end portion of the base plate 44 and welding thereto by a plurality of locations.

The flexure 48 of each suspension assembly 30 comprises a metal plate (lining layer) of, for example, stainless steel used as a base, an insulating layer formed on the metal plate, a conductive layer formed on the insulating layer to constitute a plurality of wirings (wiring patterns) and a cover layer (a protecting layer or insulating layer) which covers the conductive layer, which form a slender belt-like multilayered plate.

The flexures 48 each include a distal end-side portion 48a and a proximal end-side portion 48b. The distal end-side portion 48a is attached to the load beam 46 and the base plate 44. The proximal end-side portion 48b extends out from a side edge of the respective base plate 44, and further extends to the proximal end portion (the actuator block 29) of the respective arm 32 therealong.

Each flexure 48 include a distal end portion located above the load beam 46, and a displaceable gimbal portion (elastic supporting portion) 52 formed in the distal end portion. The magnetic head 17 is mounted in the gimbal portion 52. The flexure 48 is electrically connected by wire to the read element and write element of the magnetic head 17, the heater, and other members.

Each flexure 48 comprises a connection end portion (tail connection terminal portion) 48c provided in one end of the proximal end-side portion 48b. The connection end portion 48c is formed into a slender rectangular shape. The connection end portion 48c is bent substantially at right angles with respect to the proximal end-side portion 48b, and is located substantially perpendicular to the arm 32. A plurality of, for example, thirteen connection terminals, (connection pads) 50 are provided in the connection end portion 48c. The connection terminals 50 are connected respectively to the wiring lines of the flexure 48. That is, the wiring lines of each flexure 48 extend substantially in its full length of the flexure 48 itself and one end of each line is electrically connected to the magnetic head 17, whereas the other end is connected to the respective connection terminal (connection pad) 50 of the connection end portion 48c.

As shown in FIG. 2, ten suspension assemblies 30 extend out from the six arms 32, and they are arranged to face parallel to each other while keeping a predetermined interval between each adjacent pair thereof. The suspension assemblies 30 include the five down-head suspension assemblies and the five up-head suspension assemblies. A down-head suspension assembly 30 and a respective up-head suspension assembly 30 in each pair are located parallel to each other with a predetermined gap therebetween, and the magnetic heads 17 of each pair face each other. The magnetic heads 17 are located to face both respective sides of the corresponding magnetic disk 18.

As shown in FIG. 2, the wiring board unit 21 comprises a reinforcing board 80, a flexible printed circuit board 100, and IC chips 54a, 54b and 54c. The flexible printed circuit board 100 comprises a substantially rectangular base unit 60, a slender belt-like relay unit 62 extending from one side edge of the base unit 60, and a substantially rectangular joint portion 64 formed to continue to a distal end portion of the relay unit 62. The joint portion 64 is attached to the reinforcing board 80. The reinforcing board 80 and the joint portion 64 are fixed to the actuator block 29, and its fixing method will be discussed later. The flexible printed circuit board 100 is constituted as a multilayer circuit board comprising two conductive layers.

On one surface (outer surface) of the base unit 60, electronic parts such as a conversion connector (not shown) and capacitors 63 are mounted and electrically connected to wiring lines (not shown). On the surface (inside) of another side of the base unit 60, two metal plates 70 and 71, which function as reinforcing boards, are attached. The base unit 60 is bent by 180 degrees along a section between the metal plates 70 and 71 so that the metal plates 70 and 71 are overlaid on to face each other. The base unit 60 is disposed on the bottom wall 12a of the housing 10, and is screwed to the bottom wall 12a with two screws. The conversion connector on the base unit 60 is connected to a control circuit board provided on a bottom surface side of the housing 10.

The relay unit 62 extends from the side edge of the base unit 60 substantially perpendicular to the side edge itself, and then changes its direction substantially at right angles and further extends toward the head actuator 23.

The joint portion 64 provided in the extending end of the relay unit 62 is attached to a placement surface 29a of the actuator block 29.

The connection end portions 48c of twelve flexures 48 are joined to a plurality of connection portions of the joint portion 64, so as to be electrically connected to the wiring lines of the joint portion 64. The connection end portions 48c are arranged along a direction parallel to the support shaft 26. The IC chips (head amplifiers) 54a, 54b and 54c are mounted on the joint portion 64, and the IC chips 54a, 54b and 54c are connected to the connection end portions 48c and the base unit 60 via the wiring lines of the FPC. Further, the joint portion 64 includes a pair of connection pads 55, and the voice coil 34 is connected to the connection pads 55.

Ten magnetic heads 17 of the actuator assembly 22 are electrically connected to the base unit 60 each via the wiring lines of the respective flexures 48, the respective connection end portions 48c, the joint portion 64 of the wiring board unit 21, and the relay unit 62. Further, the base unit 60 is electrically connected to the printed circuit board on the bottom surface side of the housing 10 via the conversion connector.

Next, the first embodiment will be described with reference to FIGS. 4 to 6.

Figure 4:
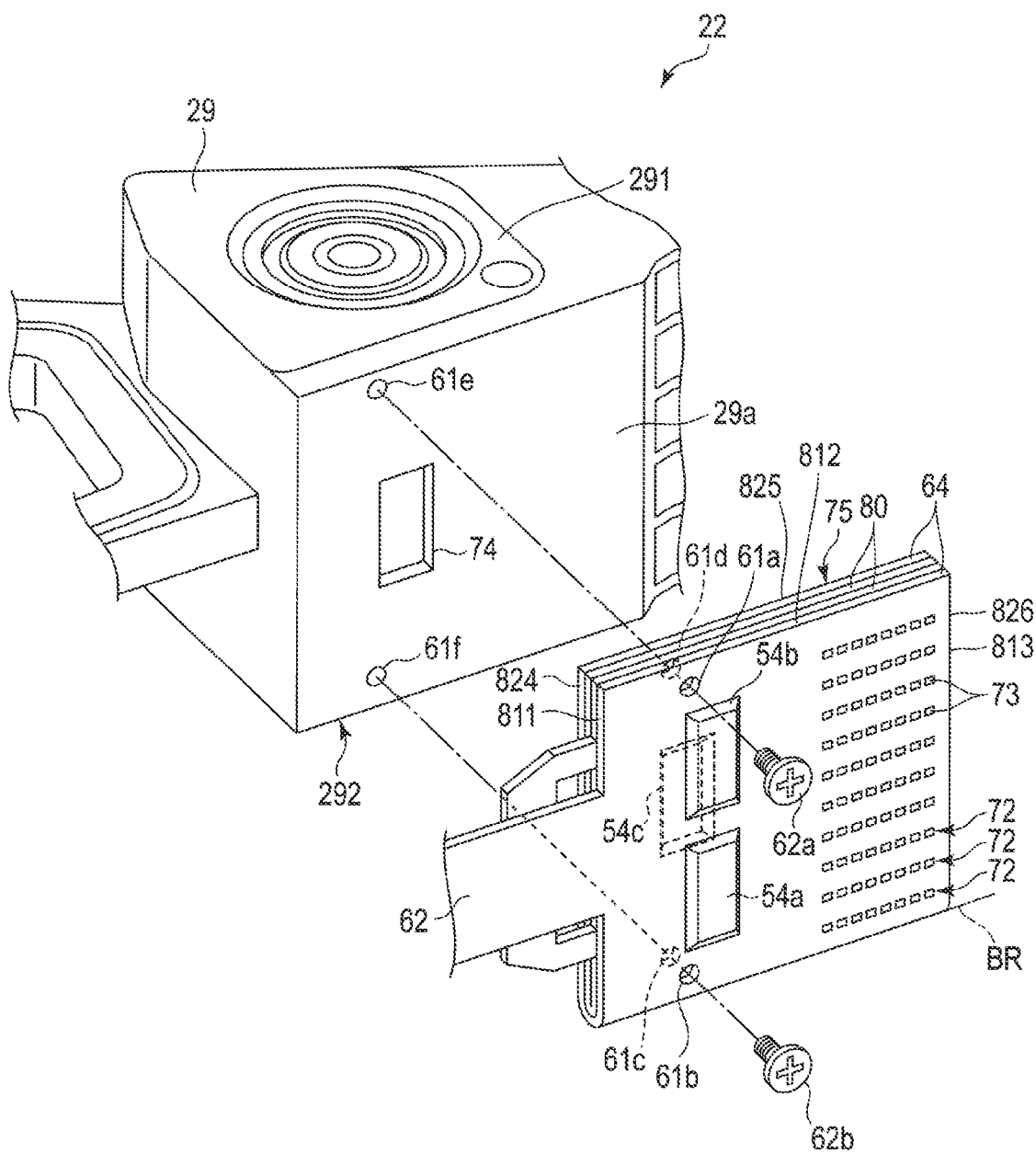
FIG. 4 is a perspective view showing a method of fixing a joint portion and a reinforcing board, according to the first embodiment.

FIG. 4 is a perspective view illustrating a method of fixing the joint portion 64 and the reinforcing board 80 according to the first embodiment. FIG. 5 is a perspective view of a state where the joint portion 64 and the reinforcing board 80 are fixed to the actuator block 29 in the step shown in FIG. 4. FIG. 6 is a developed view of the joint portion 64 and the reinforcing board 80 shown in FIGS. 4 and 5.

Figure 6:
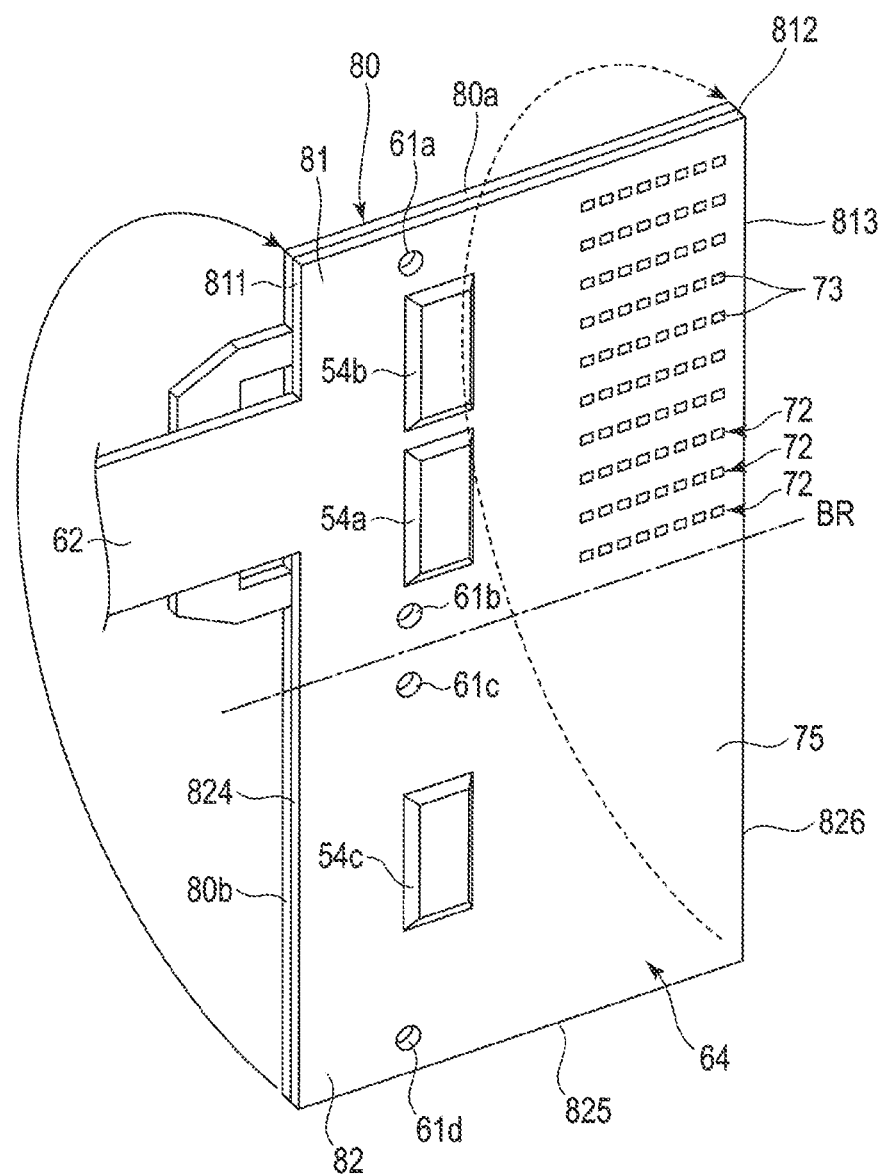
FIG. 6 is a developed view of the joint portion and the reinforcing board shown in FIGS. 4 and 5.

As shown in FIG. 6, the joint portion 64 includes a first plane 81 and a second plane 82. The IC chips (first IC chips) 54a and 54b are mounted on the first plane 81, and the IC chip (second IC chip) 54c is mounted on the second plane 82. The joint portion 64 is bent at a border BR between the first plane 81 and the second plane 82.

The first plane 81 comprises a first end portion 811 extending in a direction intersecting the border BR, a second end portion 812 extending in an extending direction of the border BR, and a third end portion 813 extending in a direction intersecting the border BR on an opposite side to the first end portion 811. The second plane 82 comprises a fourth end portion 824 extending in a direction intersecting the border BR, a fifth end portion 825 extending in an extending direction of the border BR, and a sixth end portion 826 extending in a direction intersecting the border BR on an opposite side to the fourth end portion 824. The relay unit 62 extends out from the first end portion 811 of the first plane 81. Thus, the relay unit 62 extends in an extending direction of the boundary BR.

The reinforcing board 80 comprises a first portion 80a attached to the first plane 81 and a second portion 80b attached to the second plane 82. Tapped holes 61a and 61b are formed to penetrate the first plane 81 and the first portion 80a. Tapped holes 61c and 61d are formed to penetrate the second plane 82 and the second portion 80b.

The joint portion 64 comprises connection pad groups 72 which correspond to the connection end portions 48c of the suspension assembly 30. In the example illustrated, the connection pad groups 72 are located on the first plane 81. The connection pad groups 72 are located on an opposite side to the relay unit 62 with regard to the IC chips 54a and 54b. Each of the connection pad groups 72 contains connection pads 73 arranged in a line, and each of the connection pads 73 is electrically connected to the base unit 60 through a wiring line. The connection pads 73 of each connection pad group 72 are arranged in a line along a direction substantially parallel to the border BR at predetermined intervals gap. The connection pad groups 72 are arranged substantially parallel to each other along a direction perpendicular to the border BR, i.e., a height direction of the actuator block 29, at predetermined intervals.

Figure 5:
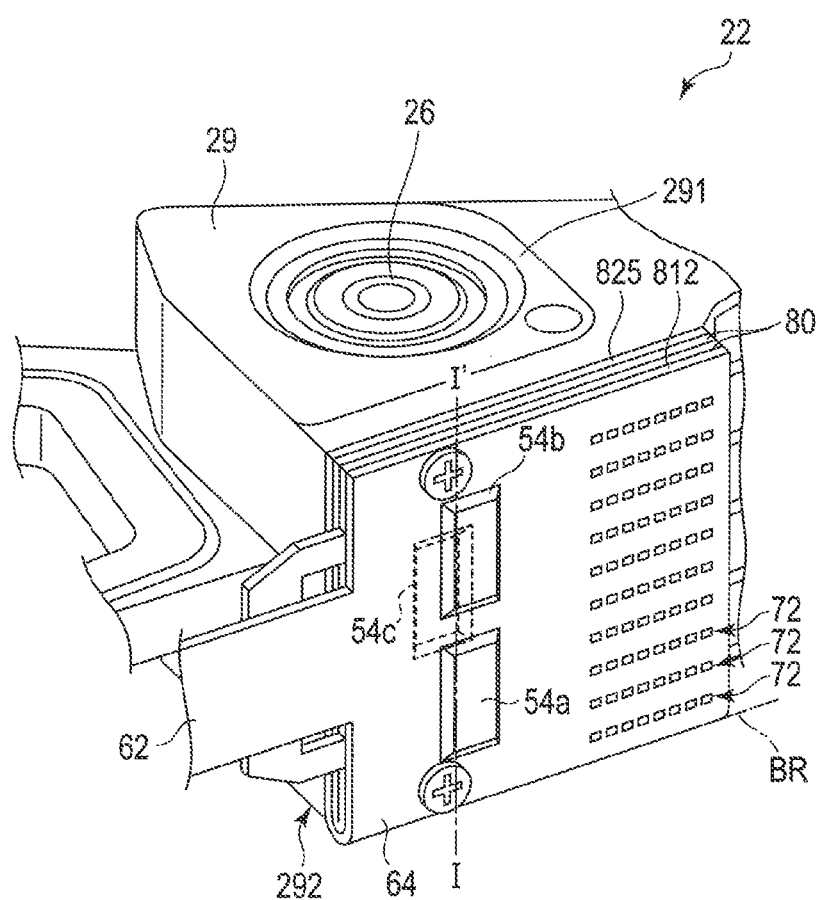
FIG. 5 is a perspective view of a state where the joint portion and the reinforcing board are fixed to the actuator block in a step shown in FIG. 4.

As shown in FIGS. 4 and 5, the joint portion 64 and the reinforcing board 80, shown in FIG. 6, are bent on the border BR, and are fixed to the actuator block 29. As the joint portion 64 and the reinforcing board 80 are bent, the first end portion 811 and the fourth end portion 824 are aligned with each other, the second end portion 812 and the fifth end portion 825 are aligned with each other, and the third end portion 813 and the sixth end portion 826 are aligned with each other. Moreover, the tapped hole 61a and tapped hole 61d are aligned with each other, and the tapped hole 61b and the tapped hole 61c are aligned with each other. The border BR extends in a direction parallel to the arm 32.

The actuator block 29 comprises a first end surface 291 extending to intersect the placement surface 29a and a second end surface 292 extending to intersect the placement surface 29a on an opposite side to the first end surface 291. Further, the actuator block 29 comprises a trench portion 74 formed in the placement surface 29a, and tapped holes 61e and 61f formed in the placement surface 29a. The screw 62a is screwed into the tapped holes 61a, 61d and 61e, and the screw 62b is screwed into the tapped holes 61b, 61c and 61f, so as to fix the joint portion 64 and the reinforcing board 80 to the placement surface 29a. The second plane 70b comprises a mount surface 75 on which the IC chip 54c is mounted, and the mount surface 75 is brought into contact with the placement surface 29a in a state where the joint portion 64 and the reinforcing board 80 are fixed to the actuator block 29. At this time, the IC chip 54c is accommodated in the trench portion 74 (see FIG. 7). Moreover, as shown in FIG. 5, the second end portion 812 and the fifth end portion 825 are located on a side of the first end surface 291, and the border BR is located on a side of the second end surface 292. The IC chips 54a and 54b are arranged in line along a direction parallel to the support shaft 26.

According to this embodiment, the joint portion 64 is bent to be mounted on the actuator block 29. With this structure, IC chips and wiring lines can be mounted not only on the first plane 81, but also on the second plane 82. Moreover, with the trench portion 74 formed in the actuator block 29, IC chips can be disposed also on the second plane 82. Thus, the mount area of the joint portion 64 can be expanded, thereby making it possible to increase the number of wiring lines, the size of IC chips, and the number of IC chips to be mounted, and thus to increase the capacity of the HDD. Moreover, the connection pad groups 72 are located in the first plane 81, and therefore they can be connected to the connection end portion 48c by a step similar to that of the conventional techniques.

Note that the number of IC chips mounted in each of the first plane 81 and the second plane 82 is not limited to that of the example illustrated. For example, a single large IC chip may be mounted on the first plane 81, or a plurality of IC chips may be mounted on the second plane 82. Or, two IC chips may be mounted on the first plane 81, and two IC chips may be mounted on the second plane 82. Four IC chips may be mounted on the second plane 82 and no IC chip mounted on the first plane 81. Or, three or more IC chips may be mounted on the first plane 81, and three or more IC chips may be mounted on the second plane 82.

Figure 7:
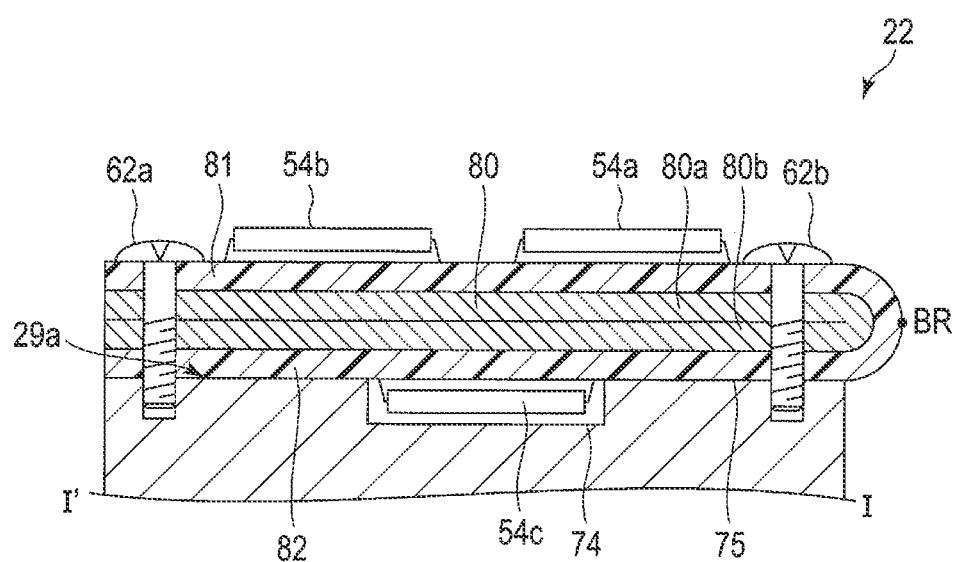
FIG. 7 is a cross section of the actuator assembly taken along line I-I' shown in FIG. 5.

FIG. 7 is a cross section of the actuator assembly 22 taken along line I-I' shown in FIG. 5.

The second plane 82 is folded back along the border BR, so as to be overlaid on the first plane 81. In the example illustrated, the reinforcing board 80 is also folded back along the border BR so that the first portion 80a and the second portion 80b are overlaid one on another. That is, the two-layered reinforcing board 80 is located between the first plane 81 and the second plane 82.

Next, the first modification of the first embodiment will be described with reference to FIGS. 8 to 10.

Figure 8:
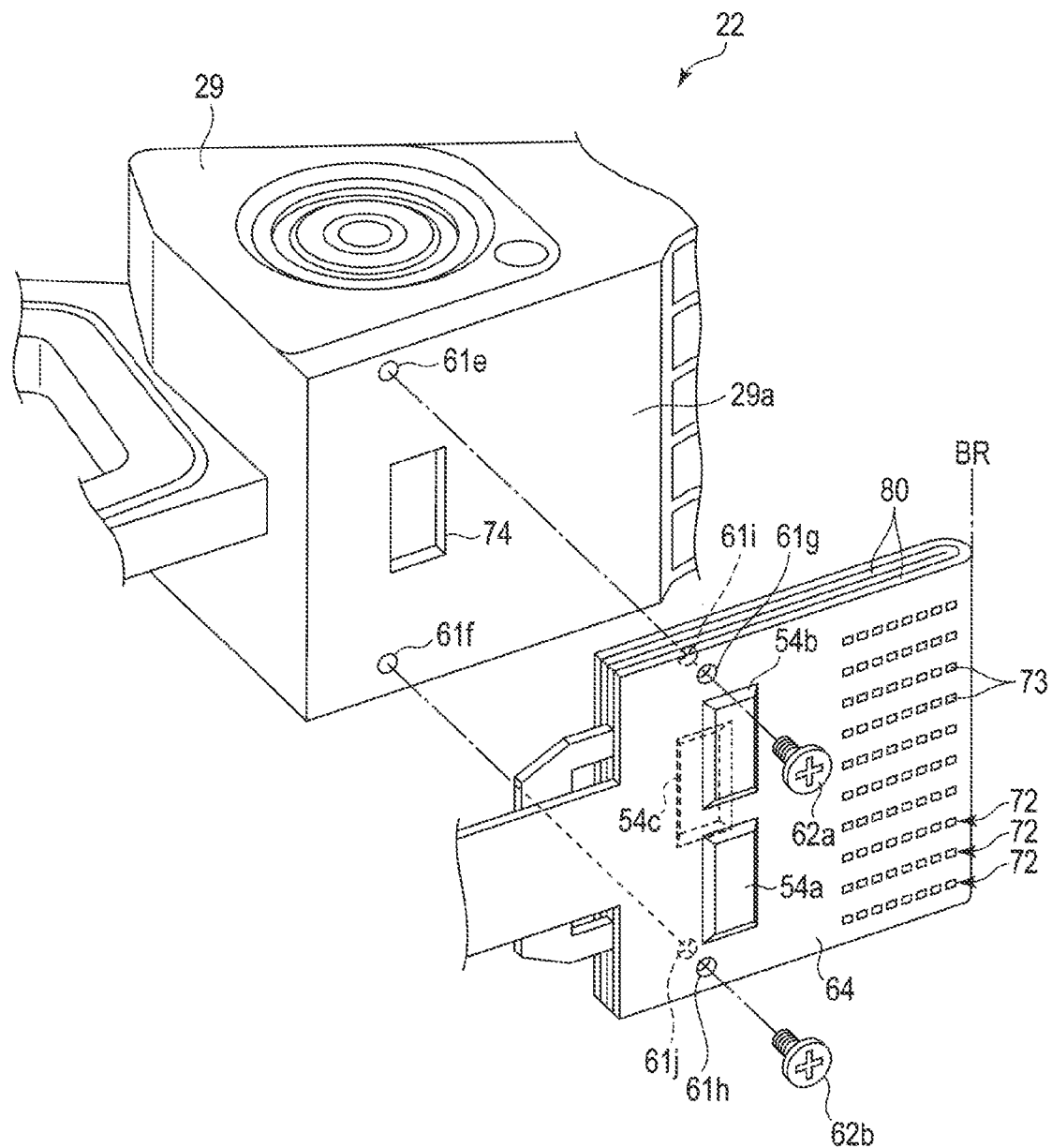
FIG. 8 is a perspective view showing the method of fixing the joint portion and the reinforcing board according to a first modification of the first embodiment.

FIG. 8 is a perspective view illustrating a method of fixing the joint portion 64 and the reinforcing board 80 according to the first modification of the first embodiment. FIG. 9 is a perspective view of a state where the joint portion 64 and the reinforcing board 80 are fixed to the actuator block 29 in the step shown in FIG. 8. FIG. 10 is a developed view of the joint portion 64 and the reinforcing board 80 shown in FIGS. 8 and 9. The first modification of the first embodiment is different from the first embodiment in that the border BR is located on an opposite side to the second end portion 812, to which the relay unit 62 is connected. In other words, the difference resides in that the border BR extends in a direction which intersects the extending direction of the arm 32.

Figure 10:
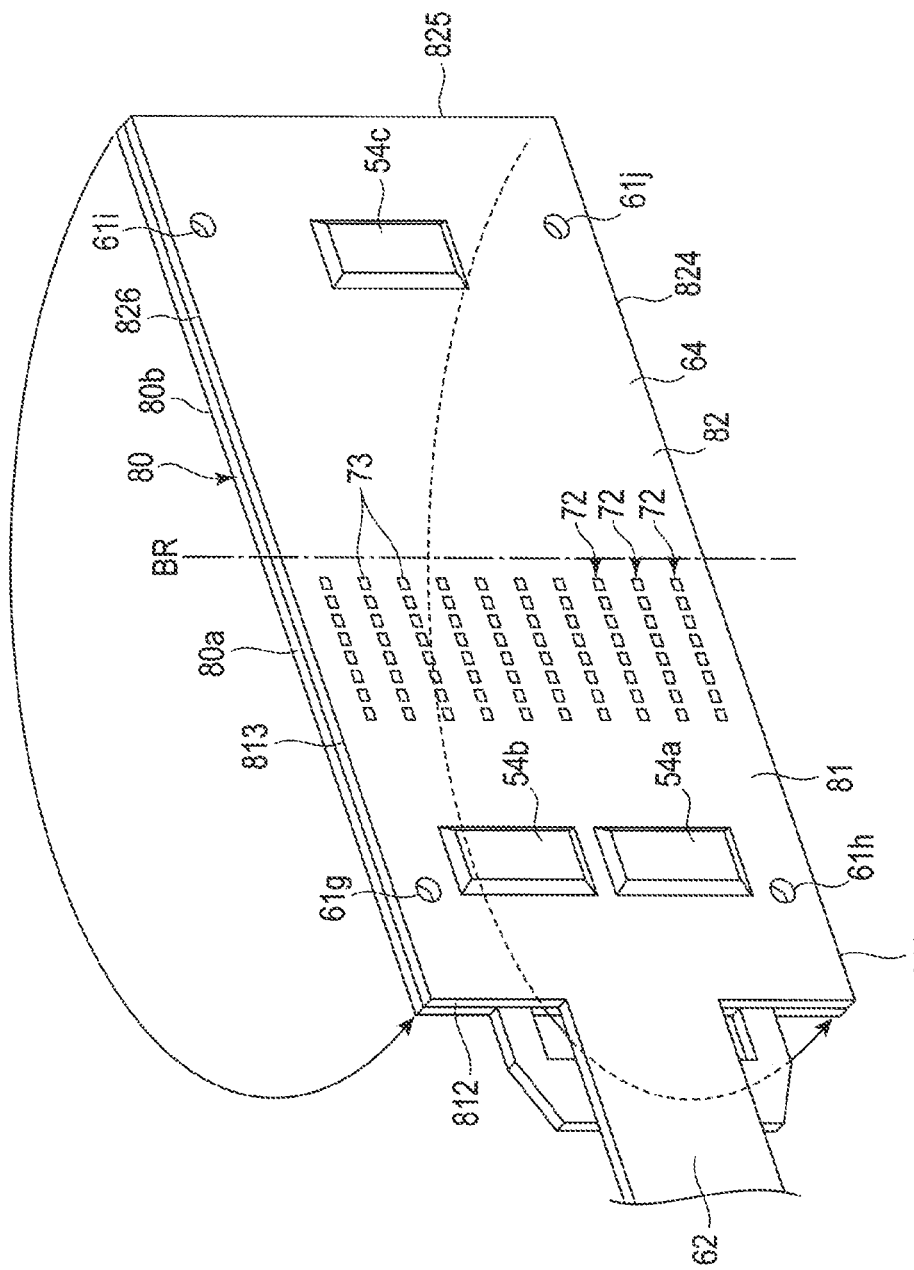
FIG. 10 is a developed view of the joint portion and the reinforcing board shown in FIGS. 8 and 9.

As shown in FIG. 10, the IC chips (first IC chips) 54a and 54b are mounted on the first plane 81, and the IC chip (second IC chip) 54c is mounted on the second plane 82. The relay unit 62 extends out from the second end portion 812 of the first plane 81. Thus, the relay unit 62 extends in a direction which intersects the boundary BR. The tapped holes 61g and 61h are formed to penetrate the first plane 81 and the first portion 80a. The tapped holes 61i and 61j are formed to penetrate the second plane 82 and the second portion 80b. A plurality of connection pad groups 72 are located on the first plane 81. The connection pad groups 72 are located between the IC chips 54a and 54b and the border BR. The connection pads 73 in each of the connection pad groups 72 are arranged in line along a direction perpendicular to the border BR at predetermined intervals. The connection pad groups 72 are arranged to be substantially parallel to each other along the extending direction of the border BR at predetermined intervals.

As shown in FIGS. 8 and 9, the joint portion 64 and the reinforcing board 80, shown in FIG. 10, are bent on the border BR, and fixed to the actuator block 29. As the joint portion 64 and the reinforcing board 80 are bent, the tapped hole 61g and the tapped hole 61i are aligned with each other, and the tapped hole 61h and the tapped hole 61j are aligned with each other. The screw 62a is screwed into the tapped holes 61g, 61i and 61e, and the screw 62b is screwed to the tapped holes 61h, 61j and 61f, to fix the joint portion 64 and the reinforcing board 80 to the placement surface 29a. As shown in FIG. 9, the third end portion 813 and the sixth end portion 826 are located on a side of the first end surface 291, and the first end portion 811 and the fourth end portion 824 are located on a side of the second end surface 292.

Next, the second modification of the first embodiment will be described with reference to FIGS. 11 to 13.

Figure 11:
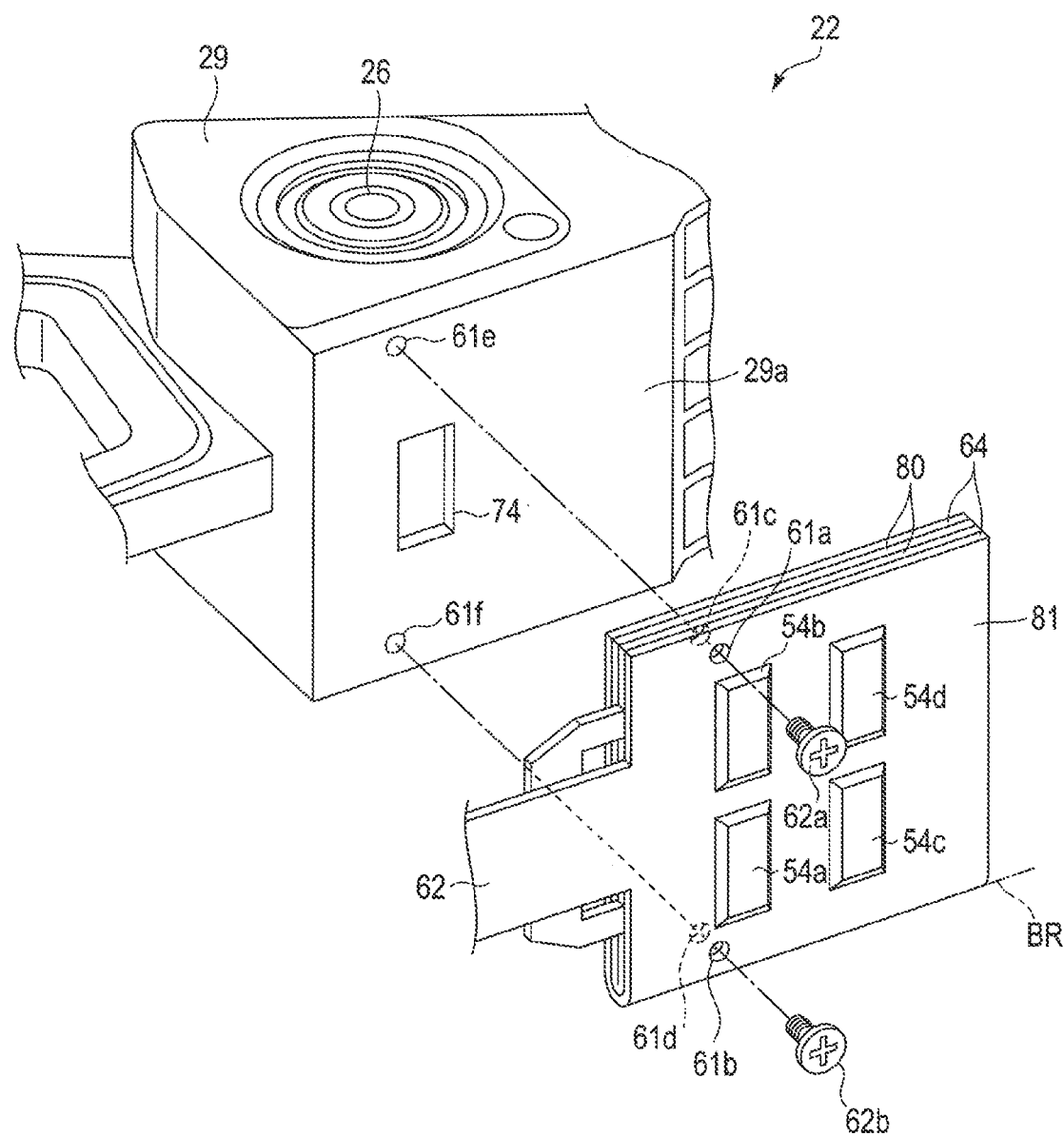
FIG. 11 is a perspective view showing the method of fixing the joint portion and the reinforcing board according to a second modification of the first embodiment.
Figure 12:
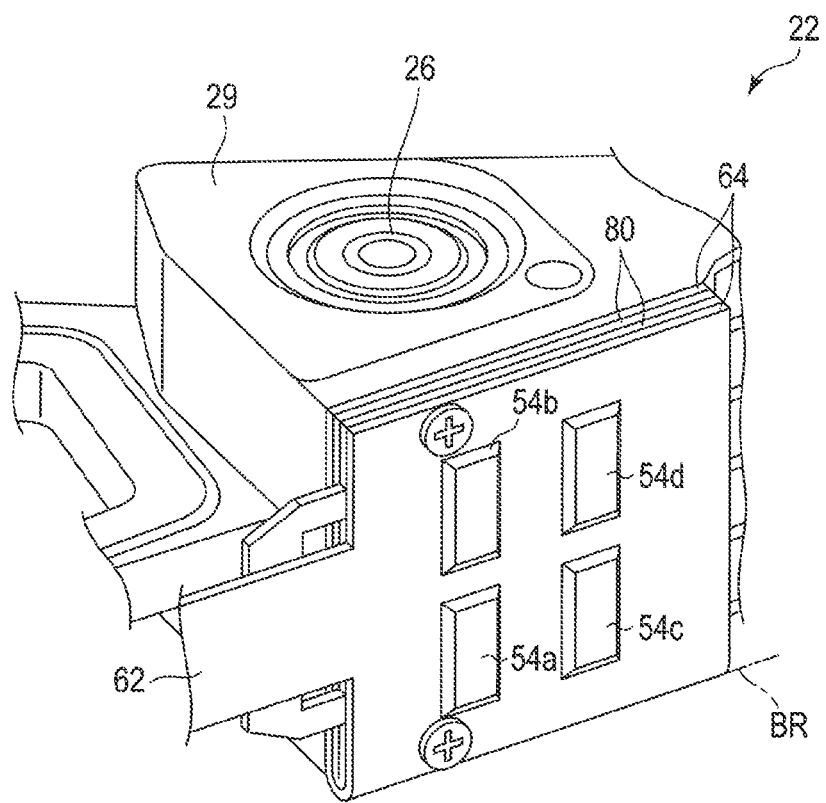
FIG. 12 is a perspective view of a state where the joint portion and the reinforcing board are fixed to the actuator block in a step shown in FIG. 11.

FIG. 11 is a perspective view illustrating a method of fixing the joint portion 64 and the reinforcing board 80 according to the second modification of the first embodiment. FIG. 12 is a perspective view of a state where the joint portion 64 and the reinforcing board 80 are fixed to the actuator block 29 in the step shown in FIG. 11. FIG. 13 is a developed view of the joint portion 64 and the reinforcing board 80 shown in FIGS. 11 and 12. The second modification of the first embodiment is different from the first embodiment in that the four IC chips 54a, 54b, 54c and 54d are mounted on the first plane 81 and the connection pad groups 72 are disposed on the second plane 82.

Figure 13:
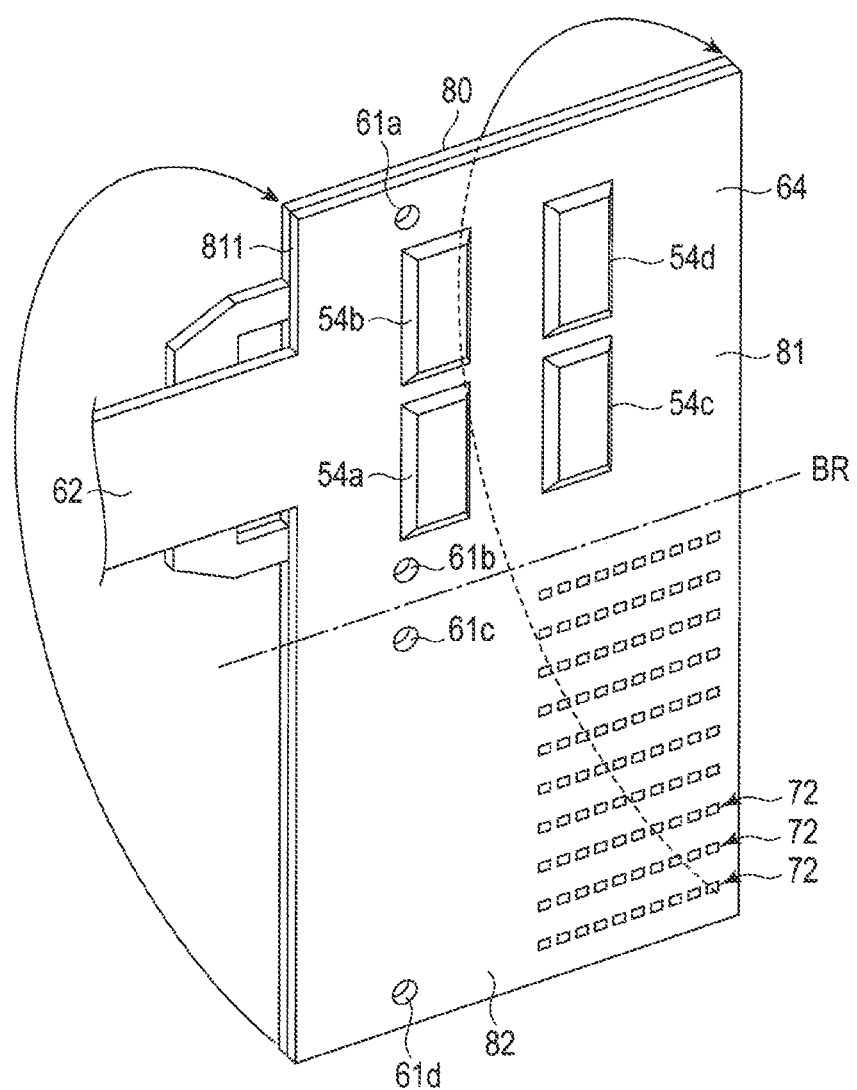
FIG. 13 is a developed view of the joint portion and the reinforcing board shown in FIGS. 11 and 12.

As shown in FIG. 13, the IC chips 54a, 54b, 54c and 54d are mounted on the first plane 81. The relay unit 62 extends out from the first end portion 811 of the first plane 81. Thus, the relay unit 62 extends in an extending direction of the boundary. A plurality of connection pad groups 72 are located on the second plane 82. As shown in FIGS. 11 and 12, a pair of the IC chips 54a and 54b are arranged in line along a direction parallel to the support shaft 26 and so are a pair of the IC chips 54c and 54d. Moreover, a pair of the IC chips 54a and 54c are arranged along a direction perpendicular to the support shaft 26 and so are a pair of the IC chips 54b and 54d. When the joint portion 64 and the reinforcing board 80 are fixed to the actuator block 29, the IC chips 54a, 54b, 54c and 54d are exposed, and the connection pad groups 72 are located on a side of the placement surface 29a. According to the second modification described above, the IC chips 54a, 54b, 54c and 54d and the connection pad groups 72 are disposed separately on the first plane 81 and the second plane 82, respectively, and with this structure, the mount area for the IC chips can be expanded. Moreover, the trench portion 74, discussed in the first embodiment, is not formed in the actuator block 29, and thus the manufacturing process can be simplified.

Next, the third modification of the first embodiment will be described with reference to FIG. 14.

FIG. 14 is a cross section of the actuator assembly 22 along line I-I' shown in FIG. 5. The example shown in FIG. 14 is different from the example shown in FIG. 7 in that the reinforcing board 80 located between the first plane 81 and the second plane 82 is formed from one layer.

The second plane 82 is folded back along the border BR, and overlaid on the first plane 81. The reinforcing board 80 comprises a first surface 801 and a second surface 802 on an opposite side to the first surface 801. The first plane 81 is in contact with the first surface 801, and the second plane 82 is in contact with the second surface 802. That is, the first plane 81 and the second plane 82 are attached respectively on both surfaces of the single-layer reinforcing board 80. According to the third modification described above, the processing step of bending the reinforcing board 80 can be omitted.

Next, the second embodiment will be described with reference to FIG. 15.

FIG. 15 is a perspective view showing an actuator assembly 22 according to the second embodiment.

IC chips (first IC chip) 54a and 54b are mounted on a first plane 81, and an IC chip (second IC chip) 54c is mounted on a second plane 82. The first plane 81 is placed on a placement surface 29a via a reinforcing board 80, and a second plane 82 is placed on a first end surface 291 via the reinforcing board 80.

According to the second embodiment, the joint portion 64 is bent and mounted on the actuator block 29. With this structure, the IC chip and wiring lines can be mounted not only on the first plane 81 but also on the second plane 82. Therefore, the mount area of the joint portion 64 can be expanded, thereby making it possible to increase the number of wiring lines, the size of IC chips, and the number of IC chips to be mounted, and thus to increase the capacity of the HDD. Moreover, the connection pad groups 72 are located in the first plane 81, and therefore they can be connected to the connection end portion 48c by a step similar to that of the conventional techniques. Moreover, the number of IC chips to be mounted can be increased without forming a trench portion 74 in the actuator block 29. Note that the number of IC chips to be mounted in each of the first plane 81 and the second plane 82, is not limited to that of the example illustrated.

As described above, according to this embodiment, a wiring board unit for disk devices which can expand the mount area of the flexible wiring board, an actuator assembly for disk devices, and a disk device comprising these can be obtained.

In the second embodiment, the other structures of the HDD are the same as those of the HDD according to the first embodiment described above.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily. The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

Moreover, the number of magnetic disks is not limited to five, but may be four or less or 6 or more, in which case, the number of suspension assemblies may be decreased or increased according to the number of magnetic disks. In the connection end portion of the suspension assembly, the number of connection terminals can be changed as needed. The materials, shapes, sizes, etc., of elements which constitute the disk device are not limited to those in the above-described embodiments, and can be changed variously as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An actuator assembly comprising:
a head actuator comprising an actuator block comprising a first surface, and a plurality of arms each extending from the actuator block, the actuator block and the plurality of arms being integrally formed as one body and being formed from aluminum, the actuator block comprising a trench portion in the first surface, and
a wiring board unit being connected to the head actuator and comprising a board, a flexible printed circuit board comprising a joint portion provided on the board, the joint portion comprising a first plane and a second plane being in contact with the first surface, a belt extending from the first plane, a plurality of connection pad groups located on one of the first plane and the second plane, a first head amplifier mounted on the first plane, a second head amplifier mounted on the second plane and accommodated inside the trench portion, and a third head amplifier mounted on the first plane, and
a first screw and a second screw fixing the joint portion and the board to the first surface of the actuator block, wherein
the joint portion is bent on a boundary between the first plane and the second plane,
the first plane comprises a first end portion extending in a direction intersecting the boundary,
the belt extends from the first end portion of the first plane,
the first head amplifier and the third head amplifier are disposed between the first screw and the second screw, and
the second head amplifier overlaps both of the first head amplifier and the third head amplifier.

2. The actuator assembly of claim 1, wherein
the belt extends from the flexible printed circuit board in a direction along the boundary, and
the connection pad groups are located on an opposite side to the belt on the first plane.

3. The actuator assembly of claim 1, wherein
the second plane is folded back along the boundary and overlaid on the first plane, and
the board of a single layer is located between the first plane and the second plane.

4. The actuator assembly of claim 1, wherein
the second plane is folded back along the boundary, and overlaid on the first plane, and
the board comprising two layers is located between the first plane and the second plane.

5. The actuator assembly of claim 4, wherein
the board comprises a first portion attached to the first plane and a second portion attached to the second plane, and
the board is also folded back along the boundary so that the first portion and the second portion are overlaid on one another.

6. The actuator assembly of claim 1, wherein an upper surface of the second head amplifier faces a bottom surface of the trench portion, and
the upper surface of the second head amplifier is spaced apart from the bottom surface of the trench portion.

7. The actuator assembly of claim 1, wherein the size of the first head amplifier is equal to the size of the second head amplifier.

8. A disk device comprising:
a disk-shaped recording medium comprising a record layer; and
the actuator assembly of claim 1.

9. An actuator assembly comprising:
a head actuator comprising an actuator block comprising a first surface, and a plurality of arms each extending from the actuator block, the actuator block comprising a trench portion in the first surface, and
a wiring board unit being connected to the head actuator and comprising a board, a flexible printed circuit board comprising a joint portion provided on the board, the joint portion comprising a first plane and a second plane being in contact with the first surface, a belt extending from the first plane, a plurality of connection pad groups located on one of the first plane and the second plane, a first head amplifier mounted on the first plane, a second head amplifier mounted on the second plane and accommodated inside the trench portion, and a third head amplifier mounted on the first plane, and
a first screw and a second screw fixing the joint portion and the board to the first surface of the actuator block, wherein
the joint portion is bent on a boundary between the first plane and the second plane,
the first plane comprises a first end portion extending in a direction intersecting the boundary,
the belt extends from the first end portion of the first plane,
the first head amplifier and the third head amplifier are disposed between the first screw and the second screw, and
the second head amplifier overlaps both of the first head amplifier and the third head amplifier.

10. The actuator assembly of claim 9, wherein
the belt extends from the flexible printed circuit board in a direction along the boundary, and
the connection pad groups are located on an opposite side to the belt on the first plane.

11. The actuator assembly of claim 9, wherein
the second plane is folded back along the boundary and overlaid on the first plane, and
the board of a single layer is located between the first plane and the second plane.

12. The actuator assembly of claim 9, wherein
the second plane is folded back along the boundary and overlaid on the first plane, and
the board comprising two layers is located between the first plane and the second plane.

13. The actuator assembly of claim 12, wherein
the board comprises a first portion attached to the first plane and a second portion attached to the second plane, and
the board is also folded back along the boundary so that the first portion and the second portion are overlaid on one another.

14. The actuator assembly of claim 9, wherein
an upper surface of the second head amplifier faces a bottom surface of the trench portion, and
the upper surface of the second head amplifier is spaced apart from the bottom surface of the trench portion.

15. The actuator assembly of claim 9, wherein the size of the first head amplifier is equal to the size of the second head amplifier.

16. A disk device comprising:
a disk-shaped recording medium comprising a record layer; and
the actuator assembly of claim 9.

* * * * *